(12) United States Patent
Star-Lack et al.

(10) Patent No.: US 6,304,084 B1
(45) Date of Patent: Oct. 16, 2001

(54) METHOD OF IMPROVED MAGNETIC RESONANCE SPECTROSCOPIC LOCALIZATION USING SPECTRAL-SPATIAL PULSES

(75) Inventors: John Star-Lack, Palo Alto; John M. Pauly, San Francisco; Daniel B. Vigneron, Corte Madera, all of CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/019,967

(22) Filed: Feb. 6, 1998

Related U.S. Application Data
(60) Provisional application No. 60/043,964, filed on Apr. 14, 1997.

(51) Int. Cl.[7] ...................................................... G01V 3/00
(52) U.S. Cl. ............................................................ 324/307
(58) Field of Search ...................................... 324/307, 309

(56) References Cited

U.S. PATENT DOCUMENTS

| | | | |
|---|---|---|---|
| 4,480,228 | 10/1984 | Bottomley | 324/309 |
| 4,983,920 | * 1/1991 | Lampman | 324/309 |
| 4,999,580 | 3/1991 | Meyer et al. | 324/309 |

OTHER PUBLICATIONS

Meyer, C. et al, Simultaneous Spatial and Spectral Selective Excitation, Magnetic Resonance in Medicine, vol. 15, pp. 287–301, 1990.

Pauly, J. et al, Parameter relations for the shinnar–le roux selective excitation pulse design algorithm, IEEE Trans. Med. Im., vol. 10, No. 1, pp. 53–65, 1991.

Pauly, J. et al., Echo–planar spin–echo and inversion pulses, MRM, vol. 29, pp. 776–782, 1993.

* cited by examiner

*Primary Examiner*—Hezron Williams
*Assistant Examiner*—Dixomara Vargas
(74) *Attorney, Agent, or Firm*—Lumen Intellectual Property Services

(57) ABSTRACT

The present invention uses spectral-spatial 180° refocusing pulses in the point resolved spectroscopy (PRESS) localization sequence. The PRESS sequence uses a series of three pulses having a tilt angle pattern of 90°-180°-180°. The first excitation pulses in the present invention is a spatially selective 90° tilt angle pulse. The following two pulses are spectral-spatial refocusing pulses which provide multi-dimensional selectivity. This feature allows for enhanced solvent suppression, reduced chemical shift induced spatial displacement and an ability to refocus weakly coupled spins. In a preferred embodiment, the spectral-spatial pulses are time-asymmetric and identical, providing for a linear phase profile by means of phase compensation between the two refocusing pulses. Alternatively, a linear phase profile can be provided by using time-symmetric refocusing pulses. The time-asymmetric feature is preferred because it results in lower applied RF power and shorter echo times.

8 Claims, 10 Drawing Sheets

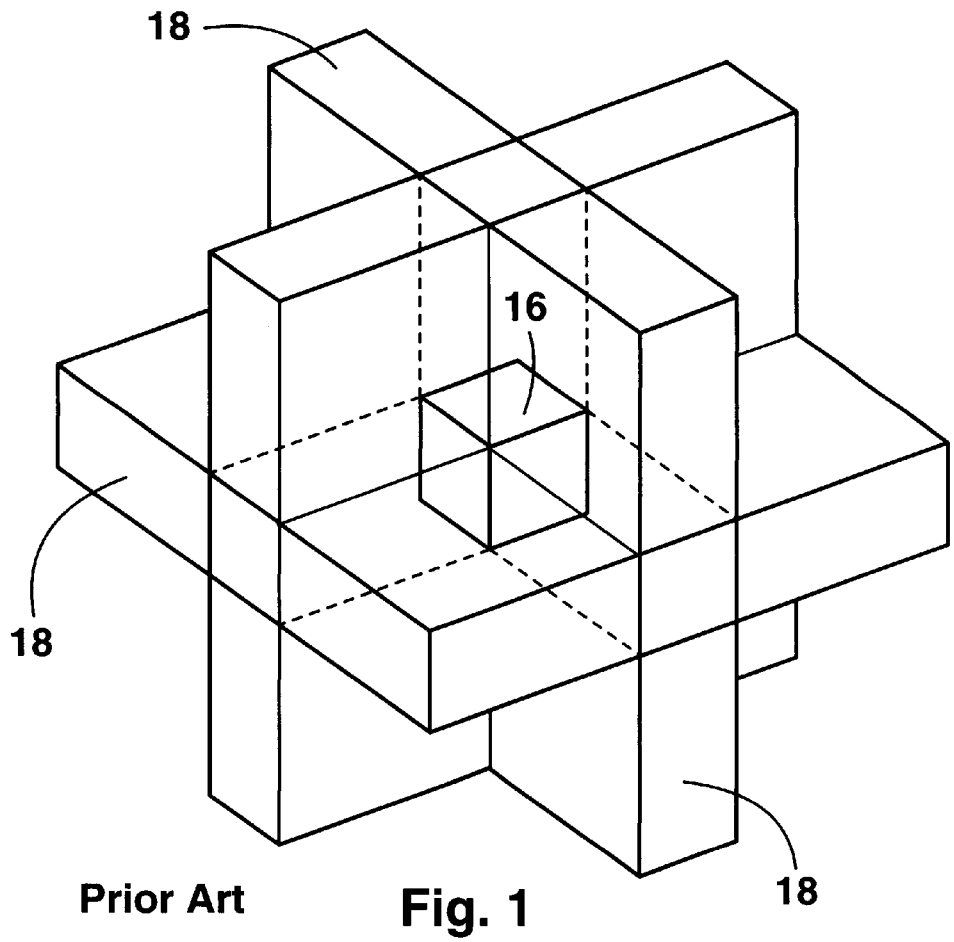
Prior Art    Fig. 1
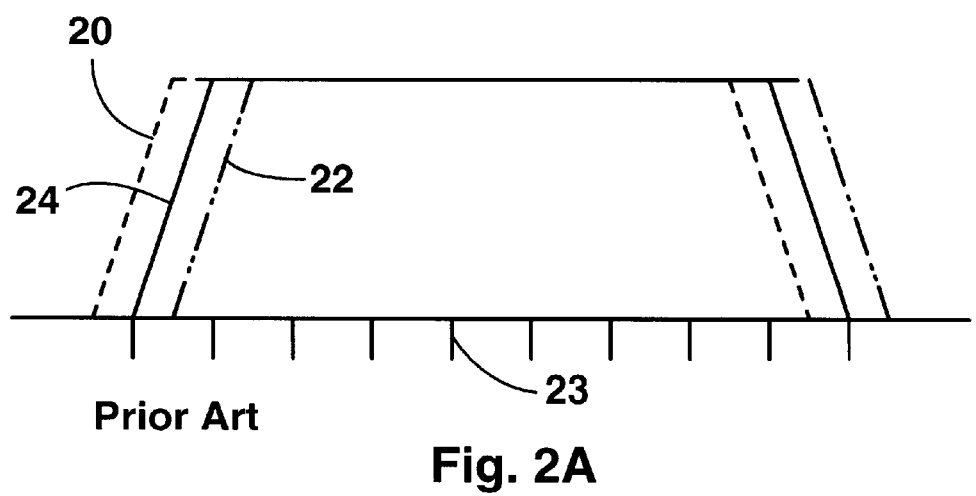
Prior Art
Fig. 2A

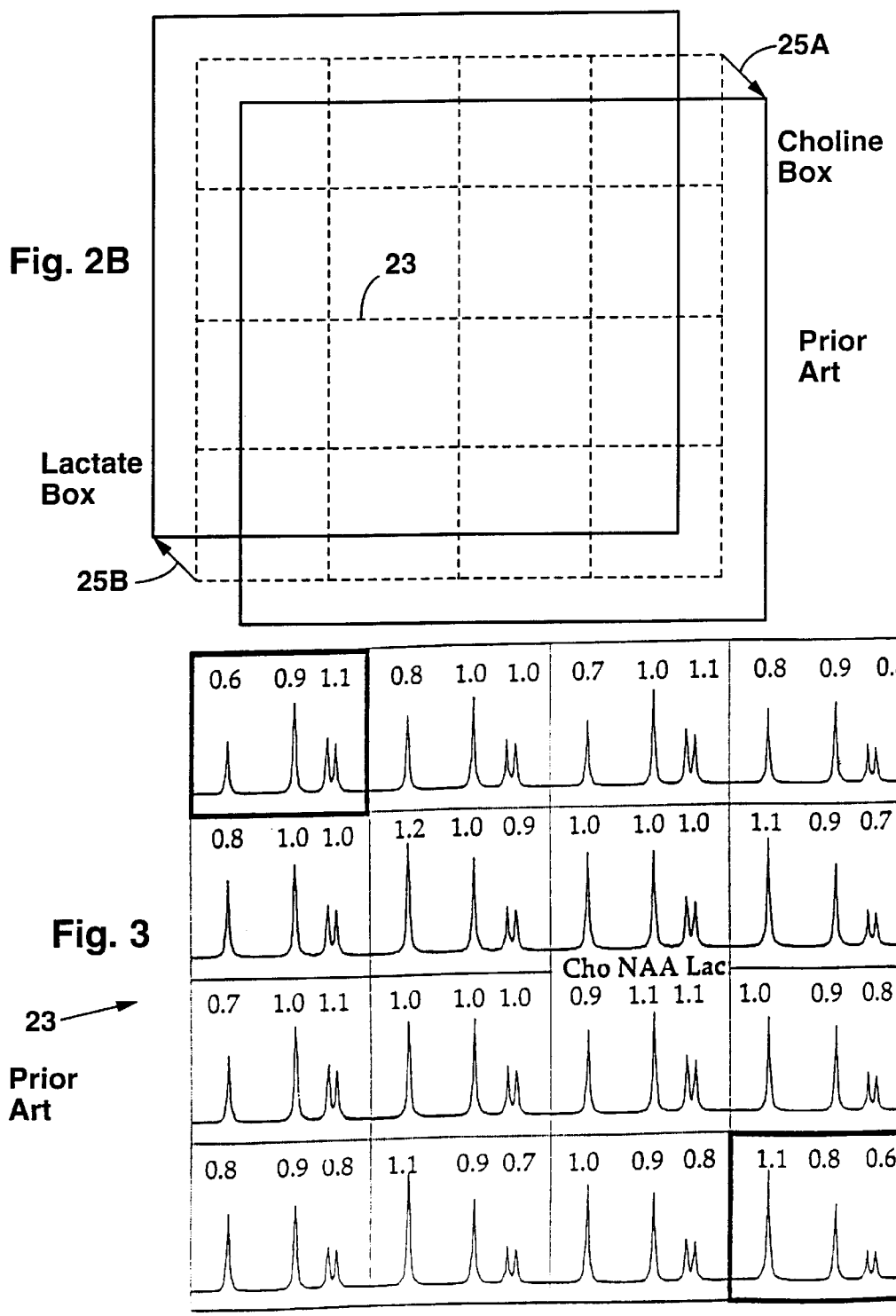

METHOD OF IMPROVED MAGNETIC RESONANCE SPECTROSCOPIC LOCALIZATION USING SPECTRAL-SPATIAL PULSES

CROSS-REFERENCE TO RELATED APPLICATIONS

This application claims the benefit of U.S. Provisional Application No. 60/043,964, filed Apr. 14, 1997.

This invention was supported in part by grant numbers CA57236and CA59880 from the National Institutes of Health (NIH). The Government has certain rights in the invention.

FIELD OF THE INVENTION

This invention relates generally to magnetic resonance spectroscopy (MRS) and magnetic resonance spectroscopic imaging (MRSI), and more specifically, to a method of magnetic resonance spectroscopic imaging using a pair of spectral-spatial pulses.

BACKGROUND OF THE INVENTION

Atomic nuclei placed in a magnetic field precess about the magnetic field vector at a frequency proportional to the magnetic field strength and the gyromagnetic ratio, which is a fundamental constant for each nuclear species. Thus, for a given nucleus, the frequency of nuclear precession is solely a function of the applied magnetic field, which can be controlled. For hydrogen nuclei, which are commonly used as the diagnostic nuclei in MRSI, the precession frequency is approximately 64 MHz at a field strength of 1.5 Tesla.

Synchronized precessing nuclei produce a macroscopic net magnetization which is the principal effect by which data is collected in magnetic resonance techniques. The net magnetization rotates at the precession frequency and therefore induces an electrical signal in a pickup coil located in proximity to the precessing nuclei. This process is called free inductive decay (FID) and is necessary for performing magnetic resonance imaging. The principal procedure used in magnetic resonance imaging is inducing the synchronization of the nuclear magnetic moments of specific nuclear species (and specific to the molecules they are in) in a small, well defined volume of space. A series of radio frequency (RF) pulses applied in concert with magnetic field gradients is used to cause this synchronization. Each RF pulse can be spatially selective and affects the nuclear spins in a specific volume of space. After a final RF refocusing pulse is applied, the nuclear spins inside a volume of interest will be in phase, and a FID spin echo signal from the resultant rotating magnetization can be captured. Only the volume of interest will have a rotating magnetization, and therefore the FID signal captured will be specific to this volume. Using sequential excitation pulses in combination with phase encoding gradients allows voxels inside the volume of interest to be localized, providing higher spatial resolution.

When hydrogen atoms are incorporated into molecules, the surrounding electron clouds affect the magnetic field strength experienced by the hydrogen nuclei. This results in a small change in the precession frequency of the hydrogen nuclei, typically on the order of 100–300 Hz for a 1.5T field as compared to the hydrogen nuclei in water, which is a standard reference. This chemical shift is different for different chemicals and allows researchers to identify and locate various chemicals and their concentrations inside the body. Fourier transform techniques, for example, are often used to calculate a chemical shift spectrum for the FID signal from each voxel. In other words, each FID signal is decomposed into its frequency components with each frequency corresponding to a component of a specific chemical. It is often desirable to simultaneously detect several chemicals in the FID signal from each voxel.

One problem with MRSI using hydrogen nuclei is the prevalence of water and lipids in the human body. Water and lipids contain large amounts of hydrogen, which can produce very powerful FID signals that can mask FID signals from chemicals of interest which are often present in lower concentrations. Choline, lactate, and creatine are examples of chemicals which have diagnostic value but are present in the body in concentrations much lower than water or lipids. For these reasons, a useful MRS/MRSI technique should be able to provide high suppression for the FID signals from water and lipids. Further, the technique should be able to simultaneously detect the FID signals from several chemicals of interest while providing for water and lipid signal suppression. Water/lipid suppression is also referred to as solvent suppression in the arts of MRS and MRSI. Improvements are needed in the art because there are circumstances in which the most commonly used techniques for water suppression (chemical shift selective (CHESS) saturation) and lipid suppression (short-time inversion recovery (STIR)) may be too sensitive to T1 or local RF magnetic field variations to be adequate for many applications.

The technique used in one of many versions of MRS/MRSI for voxel localization is to apply a sequence of three frequency selective RF excitation/refocusing pulses synchronized with magnetic field gradients in three orthogonal directions. Each RF pulse excites nuclear moments having precession frequencies located within a predetermined bandwidth. Refer now to FIG. 1. For each pulse, the bandwidth of the pulse selects a planar region 18 of space due to the magnetic field gradient applied during the pulse. Each plane 18 is perpendicular to one of the three magnetic field gradients applied during the three RF pulses. At the end of a three-pulse sequence, a voxel 16 located at the intersection of the three planar, orthogonal regions 18 has been selected. Due to the chemical shifts of different chemicals, the voxels for different chemicals will be displaced in all 3orthogonal directions with respect to one another. FIG. 2A illustrates the chemical shift induced spatial displacements for water 20 and lipids 22, which have rather widely separated chemical shifts. Both the water 20 and lipid 22 excitation profiles are displaced with respect to the chemical shift imaging grid 23 (CSI grid). The CSI grid 23 serves as a reference for the construction of images, so it is important to have the chemicals of interest accurately located with respect to the CSI grid 23. Only one specific chemical shift on resonance 24 is not displaced with respect to the CSI grid, however. FIG. 2B illustrates the chemical shift induced spatial displacement in 2 dimensions for choline 25A and lactate 25B. The chemical shift induced spatial displacement maps the chemical shift into spatial displacement in all three orthogonal directions. It would be a significant improvement in MRS/MRSI technology to be able to reduce or eliminate the chemical shift induced spatial displacement.

The chemical shift induced spatial displacement also inhibits the accurate quantification of chemical concentrations and chemical concentration ratios. This is a problem because such chemical concentrations and concentration ratio measurements can be a key factor in distinguishing healthy tissue from diseased tissue. Lactate, for example, may be a marker indicating the presence of active cancer. FIG. 3 shows a CSI grid 23 of 16voxels with the choline (Cho), N-acetyl-L-aspartate (NAA), and lactate (Lac) concentrations in each voxel. If no chemical shift induced spatial displacement is present, then each voxel will measure 1.0 (a normalized figure) for each of Cho, NAA, and Lac. The spatial displacement effect distorts these values, however, and the effect is most pronounced for the voxels at the highlighted corners (upper left and lower right) in the direction of the displacement 24 (see FIG. 2). The chemical shift induced spatial displacement thus adversely effects the accuracy of MRSI chemical concentration measurements.

It is known in the art of MRSI that spectral-spatial pulses can be designed which are selective in space as well as in frequency. Spectral-spatial pulses require the use of time-varying magnetic field gradients which are synchronized with the refocusing pulse and provide the desired spatial selectivity without chemical shift selectivity.

It is also known in the art that spectral-spatial refocusing pulses can provide enhanced, accurately controllable chemical shift selectivity. More specifically, the excitation passband of spectral-spatial pulses can be made with sharp edges and can have an accurately determined width and location.

OBJECTS AND ADVANTAGES OF THE INVENTION

It is an object of the present invention to provide a method for magnetic resonance spectroscopic imaging that provides volume localization and that:

1) provides for enhanced solvent suppression (such as water/lipid suppression) compared with prior art techniques,
2) greatly reduces the chemical shift induced spatial displacement such that the voxels corresponding to different chemicals closely overlap,
3) addresses problems associated with coupled spin systems, and
4) allows the use of RF pulses of short duration.

These and other objects and advantages of the present invention will be apparent upon consideration of the following description and the accompanying drawings.

SUMMARY OF THE INVENTION

These objects and advantages are attained by using a 90° tip angle RF pulse followed by two 180° refocusing pulses wherein the two 180° pulses are spatially and spectrally selective (spectral-spatial pulses). The 90-180-180 pulse sequence is well known in the art of MRS/MRSI as the point resolved spectroscopy (PRESS), pulse sequence. In the present invention the last two 180° pulses are spectral-spatial pulses which are capable of being simultaneously selective in the frequency domain and the spatial domain. The spectral-spatial pulses can be designed to avoid excitation of water and lipids. More generally, the spectral-spatial pulses can be designed to suppress the signal from any unwanted chemical species, provided that the unwanted chemical species is sufficiently separated in precession frequency from chemical species of interest.

Preferably, the two 180° spectral-spatial pulses are mutually phase compensating. In other words, the nuclear magnetic moments of all affected nuclei (nuclei within the excitation passband) will be oriented in phase at the time of the spin echo, regardless of chemical shift. Mutual phase compensation can be achieved by making the two 180° spectral-spatial pulses identical, even if they are asymmetric in time. Alternatively, the 180° pulses can be symmetric in time, in which case each pulse will be linear phase and no phase compensation is required.

Also, the present invention can selectively refocus the spectral components of coupled spin systems such that they are rephased in a short time.

BRIEF DESCRIPTION OF THE FIGURES

FIG. 1 (prior art) illustrates how three perpendicular excitation planes intersect to isolate a cube-shaped volume of interest.

FIGS. 2A, 2B (prior art) illustrate the chemical shift induced spatial displacement.

FIG. 3 (prior art) illustrates that the chemical shift induced spatial displacement distorts chemical concentration measurements in each voxel of the volume of interest.

DETAILED DESCRIPTION

Figure 4:
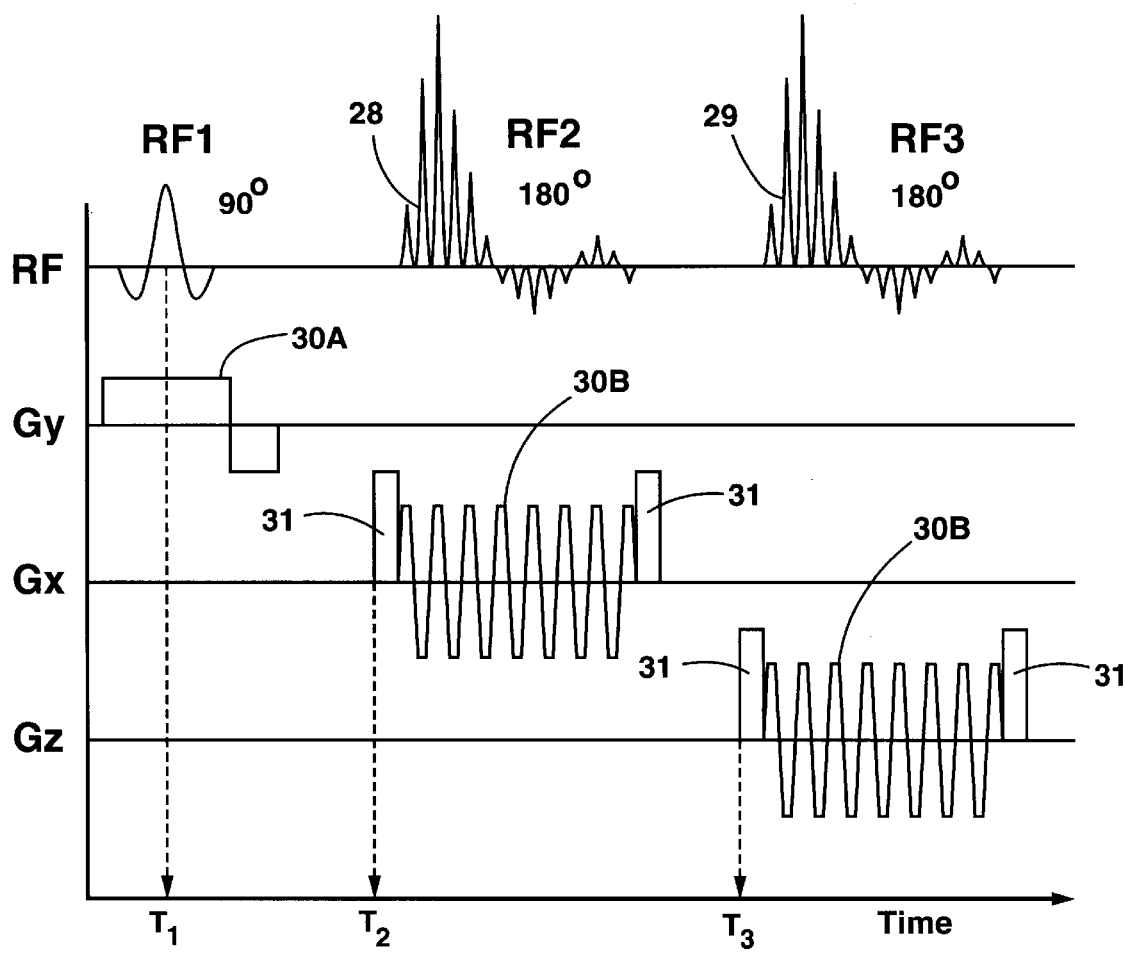
FIG. 4 is a timeline of the pulse sequence of the present invention.

A preferred embodiment of the pulse sequence of the present invention is shown in FIG. 4. The present invention uses the known PRESS (point resolved spectroscopy) pulse sequence which consists of three radio frequency (RF) pulses producing nuclear tilt angles of 90°, 180°, and 180°, respectively. Reference can be made to U.S. Pat. No. 4,480, 228 to Bottomley concerning the PRESS sequence. RF1 is a 90° tilt angle pulse, and RF2 28 and RF3 29 are 180° tilt angle refocusing pulses. RF2 28 and RF3 29 generate a spin echo as is well known in the art. The spin echo occurs after RF3 29.

Gx, Gy, and Gz indicate magnetic field gradients 30A, 30B applied in three mutually orthogonal directions during RF1, RF2, and RF3. The use of magnetic field gradients 30A, 30B is well known in the art of MRI, MRS, and MRSI. The magnetic field gradients 30A, 30B applied during the refocusing pulses RF2 and RF3 are preferably preceded and followed by "crusher" gradients 31 which dephase unwanted spins outside the voxel being analyzed. The use of crusher gradients 31 is well known in the art.

In all the embodiments of the present invention, RF2 and RF3 are spectral-spatial refocusing pulses. Spectral-spatial pulses are special RF pulses which, when synchronized with time-varying magnetic field gradients 30A, 30B, allow for simultaneous spectral and spatial selectivity. Articles describing the design and functioning of spectral-spatial pulses can be found in the literature. Specifically, reference can be made to "Echo Planar Spin-Echo and Inversion Pulses", Pauly J, Spielman D, Macovski A, Magnetic Resonance in Medicine, 1993; 29:776–782. Reference can also be made to "Simultaneous Spatial and Spectral Selective Excitation", Meyer C, Pauly J, Macovski A, Nishimura G, Magnetic Resonance in Medicine, 1990; 15,287–304. U.S. Pat. No. 4,999,580 to Meyer et. al. also describes the design of spectral spatial pulses. These papers disclose that spectral-spatial pulses can be used to selectively excite desired chemical species, based on their chemical shift. In other words, spectral-spatial pulses allow one to select a desired chemical shift passband with an accurate, predetermined location and width. Thus, spectral-spatial pulses applied to PRESS can yield improved solvent suppression by locating undesired solvents outside the passband, as described below.

Figure 5:
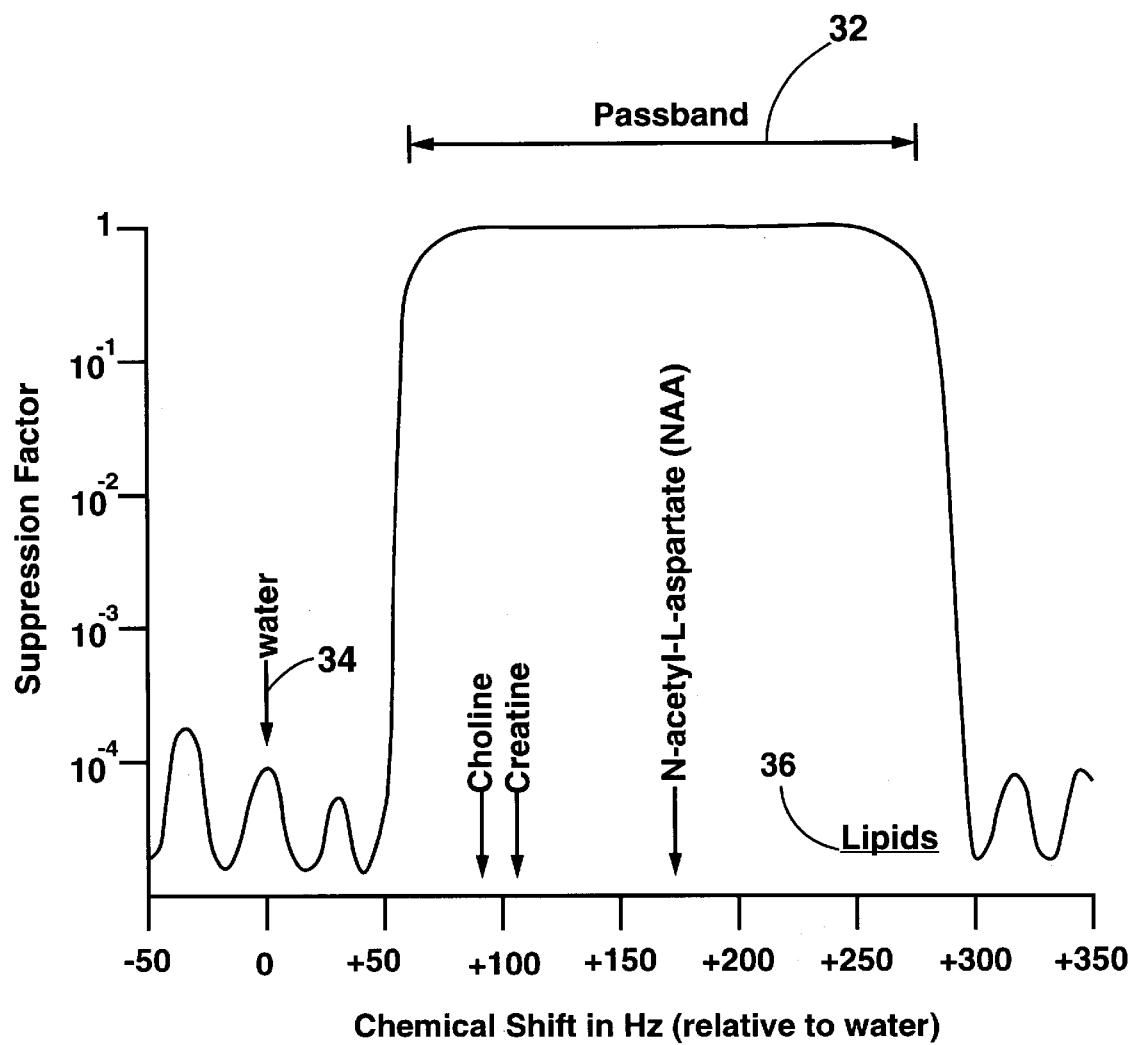
FIG. 5 is a graph illustrating the spectral profile of a particular embodiment of the present invention which suppresses the FID signal from water.

FIG. 5 shows a specific spectral excitation profile that can be produced by two spectral-spatial refocusing pulses (RF2 and RF3). All nuclear spins within a predetermined range of chemical shift (passband 32) will be refocused and so will contribute to the resultant spin echo signal. Nuclear spins with a chemical shift outside the passband 32 will not be refocused and will not contribute to the spin echo signal. Chemicals such as choline, creatine and NAA, which are located within the passband, are refocused and therefore contribute to the spin-echo signal. The refocusing pulses providing the spectral profile of FIG. 5 were designed such that water 34 (more specifically, the precession frequency of hydrogen nuclei in water) lies outside the passband 32 and therefore does not contribute to the spin echo signal. This is an example of solvent suppression according to the present invention. By appropriately designing the spectral-spatial pulses, the passband 32 can have a desired width and position. This allows one to select which chemical species will be refocused. The references cited above provide the details on how to design spectral-spatial pulses (RF2 and RF3) with any desired passband 32 (width and location).

Locating water 34 outside the passband 32 is an effective means of providing water/solvent suppression. In FIG. 5, lipids 36 are located within the passband. If desired, the passband 32 could be narrowed to exclude both lipids 36 and water 34.

All the chemical species located within the passband 32 are preferably refocused with a linear phase profile. In other words, all the nuclear magnetic moments within the passband 32 will be in phase after the application of RF3, regardless of chemical shift. At the echo time there is no phase difference between refocused magnetic moments. The benefits of linear phase refocusing in MRI, MRS, and MRSI are well known in the art. For example, linear phase refocusing provides for simplified processing of the resultant FID spin echo signal.

Two identical and time-asymmetric 180° refocusing pulses (as in FIG. 4) necessarily result in a linear phase refocusing of the nuclear moments. Time-asymmetric refocusing pulses also have the advantage of being shorter than time-symmetric pulses. This is beneficial because it requires lower duty cycle from the RF amplifiers which supply the refocusing pulses. Additionally, shorter refocusing pulses allow MRSI images to be acquired with a shorter echo time. For these reasons, time-asymmetric pulses are preferred in the present invention. It will be obvious to one skilled in the art of spectral-spatial pulse design how to design an appropriate time-asymmetric refocusing pulse for a particular application.

The 90° pulse (RF1) of FIG. 4 is spatially selective along the Y axis, RF2 is spatially selective along the X axis, and RF3 is spatially selective along the Z axis. RF1 is centered at time $T_1$, and RF2 and RF3 begin at times $T_2$ and $T_3$ respectively. $T_1$, $T_2$, and $T_3$ are indicated on FIG. 4. RF2 and RF3 are both assumed to be of equal duration, and are separated in time by $\Delta t_{23}$. The time separation between RF1 and RF2 is given by $\Delta t_{12}$.

Using the spin-domain formalism, the four dimensional transverse magnetization excitation profile $M_{xy}(x,y,z,\omega,\tau_{rd})$, at the time of readout $\tau_{rd}$, is readily determined:

$$M_{xy}(x,y,z,\omega,\tau_{rd}) = (\beta_3(z,\omega) \cdot \beta_2(x,\omega)^*)^2 \cdot \exp(-i\omega(t_{rd} - 2\Delta t_{23}))$$
$$M_{xy}(y). \quad (Eq1)$$

T2 effects (spin-spin relaxation) have been ignored, and it is assumed that $\Delta t_{23} > \Delta t_{12}$. $M_{xy}(y)$, the excitation profile after application of RF1, is assumed to be of uniform intensity across the spectral passband of RF2 and RF3. RF2 and RF3 are described by two-dimensional Cayley-Klein parameters $\beta_2(x,\omega)$, $\beta_3(z,\omega)$ defined by:

$$\beta_2(x,\omega) = i(n_y - in_x)\sin(\theta(x,\omega)/2),$$
$$\beta_3(x,\omega) = i(n_y - in_x)\sin(\theta(z,\omega)/2),$$

where $\theta(x,\omega)$ is the flip angle at a particular X-axis position and spectral frequency $\omega$, and $n=(n_x, n_y, 0)$ is the unit vector denoting the axis of rotation.

Equation 1 shows that when $\beta_3(z,\omega) \cdot \beta_2(x,\omega)^*$ is real the resulting phase in the spectral domain is linear and an echo occurs at the conventional PRESS echo time of $TE=2\Delta t_{23}$. Therefore, when RF2=RF3 and the spins are properly refocused in the spatial domains (x,z) spectral spatial pulses that are designed using the Parks-McClellan algorithm, in conjunction with the SLR transform to be maximum or minimum phase in the spectral domain, may be used conveniently for PRESS excitation to reduce the overall pulse duration. In many cases, for a given set of spectral passband, stopband, and transition band filter design parameters, two minimum or maximum phase pulses can be implemented in nearly the same time as required for one linear phase pulse.

Equation 1 demonstrates that two identical, time-asymmetric refocusing pulses will be mutually phase compensating. Equation 1 more generally shows that any two refocusing pulses (RF2, RF3-identical or different) with identical phase profiles over the passband 32 will be phase compensating and therefore can be used in the PRESS sequence. In other words, for phase compensation, the pulses themselves do not need to be identical; only the phase profiles need to be identical. The chemical shift spectrum induced by a pair of phase compensating refocusing pulses will be of linear phase. A pair of two identical pulses represent a specific, obvious case of two pulses having identical phase profiles.

A distinct benefit of spectral spatial pulses is their potential for providing a substantially increased bandwidth in the spatial domain. This can be appreciated by viewing a spectral-spatial pulse as a concatenation of a series of short subpulses each with flip angles much less than 180°. For a given maximum RF power capability, each subpulse can have a significantly higher bandwidth than for a single 180° one-dimensional spin echo pulse. This effect is important for reducing the chemical shift induced spatial displacement.

Figure 6:
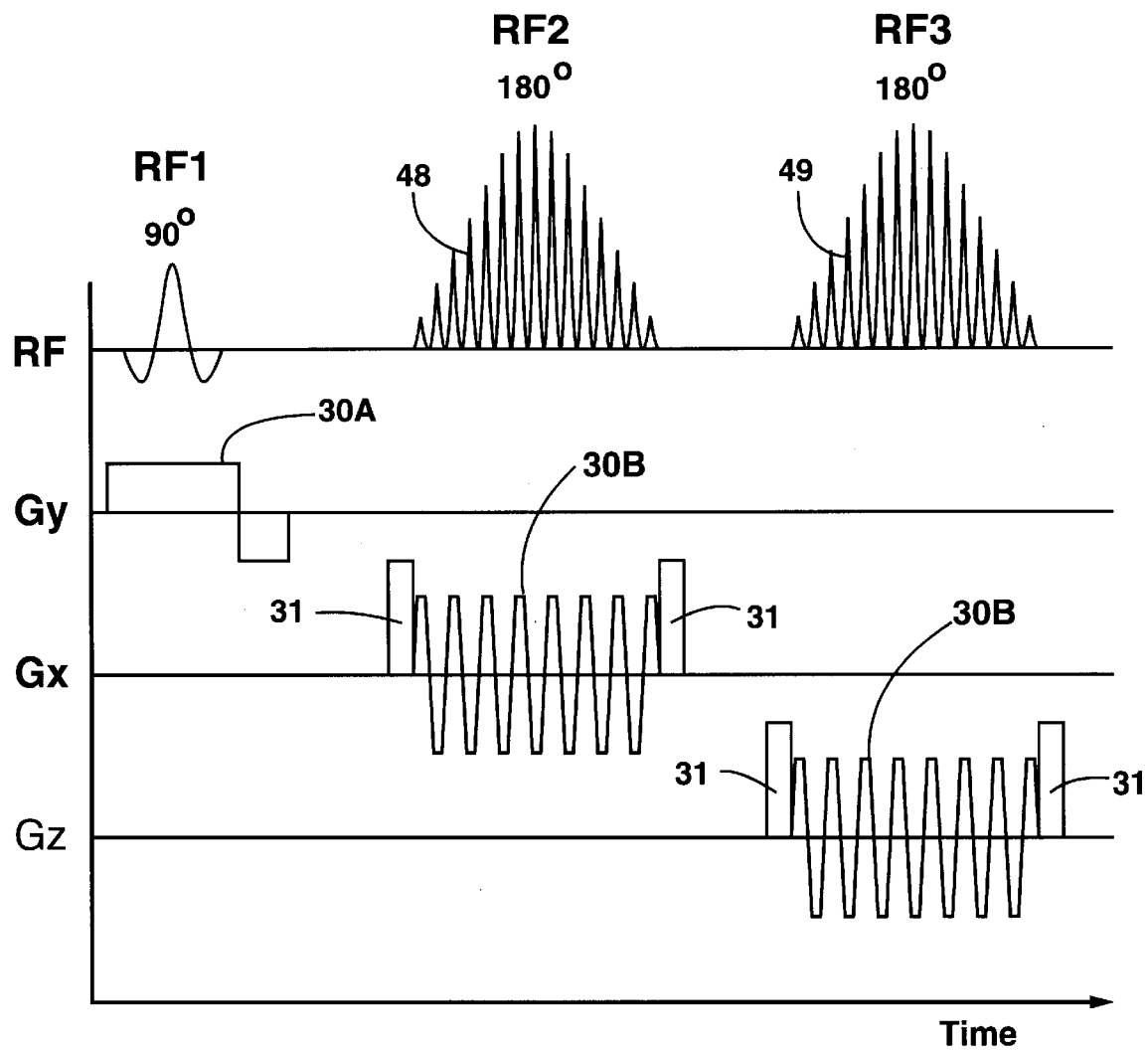
FIG. 6 is a timeline of a pulse sequence according to the present invention which uses two time-symmetric refocusing pulses.

Refer now to FIG. 6. Alternatively, RF2 48 and RF3 49 can be symmetric in time as shown. Due to the time-symmetry of each pulse, RF2 48 and RF3 49 are each linear phase and therefore the combination of RF2 48 and RF3 49 is of linear phase. RF2 48 and RF3 49 do not need to have identical phase profiles because no phase compensation is needed.

Figure 7:
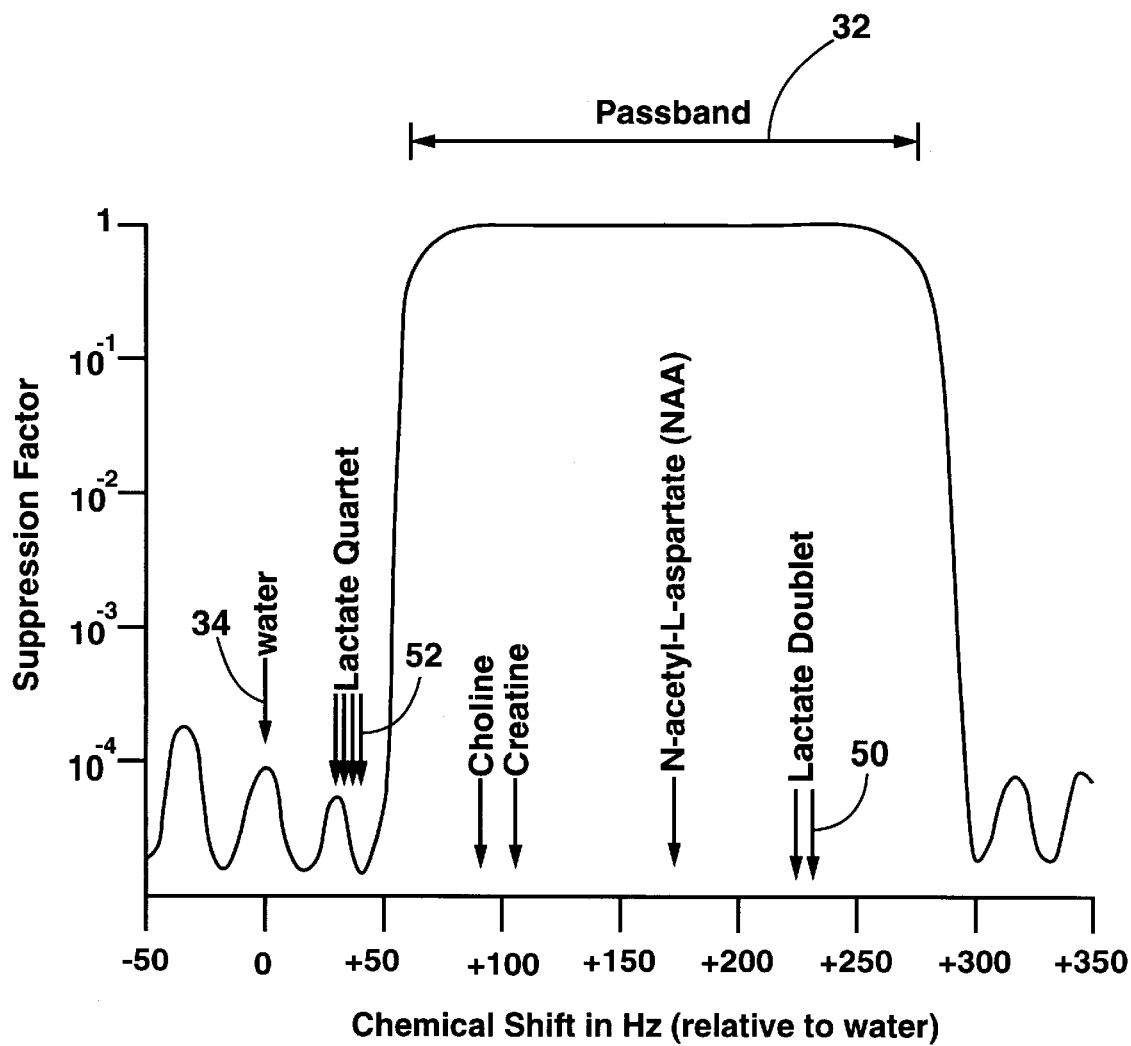
FIG. 7 illustrates how the present invention is able to selectively refocus coupled spins. The lactate doublet is refocused and the lactate quartet is suppressed.
Figure 8:
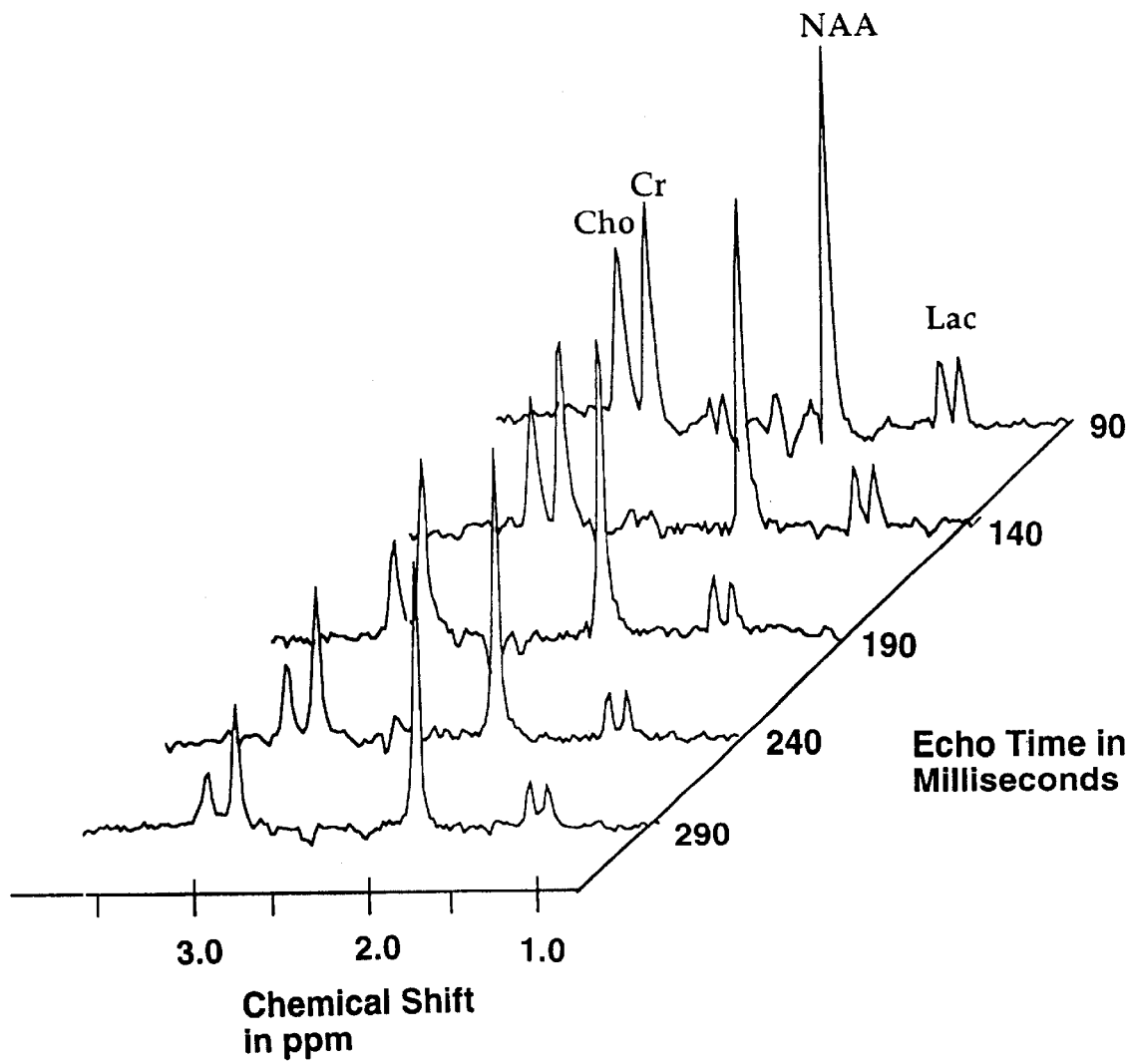
FIG. 8 shows a stacked plot of spectra acquired at different echo times, illustrating that the lactate doublet is properly rephased independently of the echo time (TE).

Refer now to FIG. 7. Some molecules with more than one hydrogen atom can cause imaging problems related to magnetic coupling between the precessing hydrogen nuclei. More specifically, if more than one group of spin states (for example, doublets and quartets) are refocused, then an unacceptably long echo time is required. For example, in the case of lactate (see FIG. 7) which has doublet 50 and quartet 52 states, if both are refocused an echo time of 288 ms is required, which is so long it precludes an acceptable signal to noise ratio. By using a passband 32 that includes the doublet 50 but not the quartet 52 spins (as shown in FIG. 7), the doublet spins will be in phase with the singlet spins (choline, creatine, and N-acetyl-L-aspartate) at all echo times past a minimum echo time. The minimum echo time depends upon the pulse durations of RF2 and RF3. Although information about the quartet is lost, the quartet is rarely measured anyway because it has a low signal to noise ratio and is too close to water to be seen. FIG. 8 shows the FID signal from the lactate doublet (labeled Lac) of FIG. 7 at several different echo times and demonstrates that the lactate doublet has been successfully rephased by excluding the quartet. The lactate doublet is rephased and upright independent of the echo time. The horizontal ppm scale of FIG. 8 is the chemical shift in parts per million of the precession frequency of water.

Most generally, weakly coupled spin systems can be dealt with by excluding a set of the spin states from the passband 32 such that the echo time is reduced to acceptable values and the excited spins are excited with linear phase. For more information concerning this technique of linear rephasing of coupled spin systems, reference can be made to "Product operator Formalism for the Description of NMR Pulse Experiments", by O. W. Sorenson, G. W. Eich, and R. R. Ernst, Prog. NMR Spectrosc., 16, 163–192, 1983.

The present invention can be used in conjunction with spatial encoding gradients to better facilitate the computation of 3-D images. The use of spatial encoding gradients is well known in the art of MRSI and it will be obvious to one skilled in the art of MRSI how to apply them to the present invention. For information concerning spatial encoding gradients reference can be made to "NMR Chemical Shift Imaging in Three Dimensions". Brown T R, Kincaid B M, and Ugurbil K. Proceedings of the National Academy of Science, USA 1982; 79:3523–3526; and "In Vivo M R spectroscopic imaging with P-31" (work in progress). Maudsley A A, Hilal S K, Simon H E, and Wittekoek S. Radiology 1984; 153:745–750.

Figure 9A:
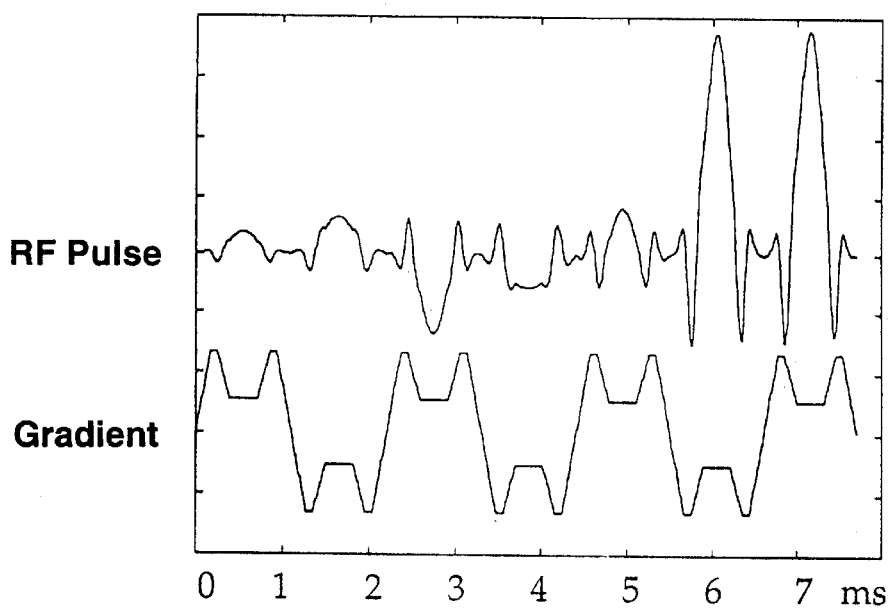
FIGS. 9A, 9B, and 9C show the RF pulse, gradient and resultant passband for a refocusing pulse having a wide passband which does not suppress water or lipids.
Figure 9B:
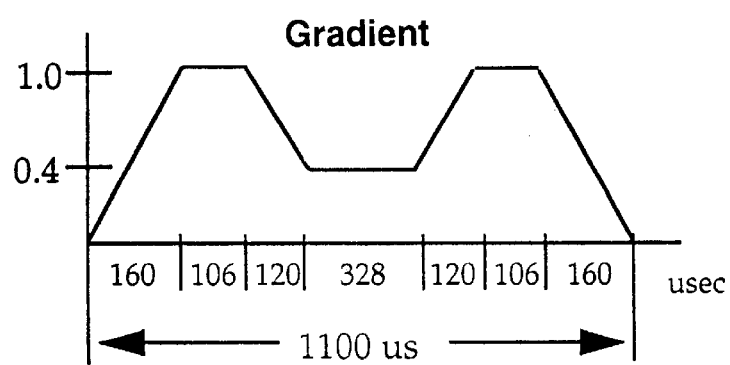
Figure 9C:
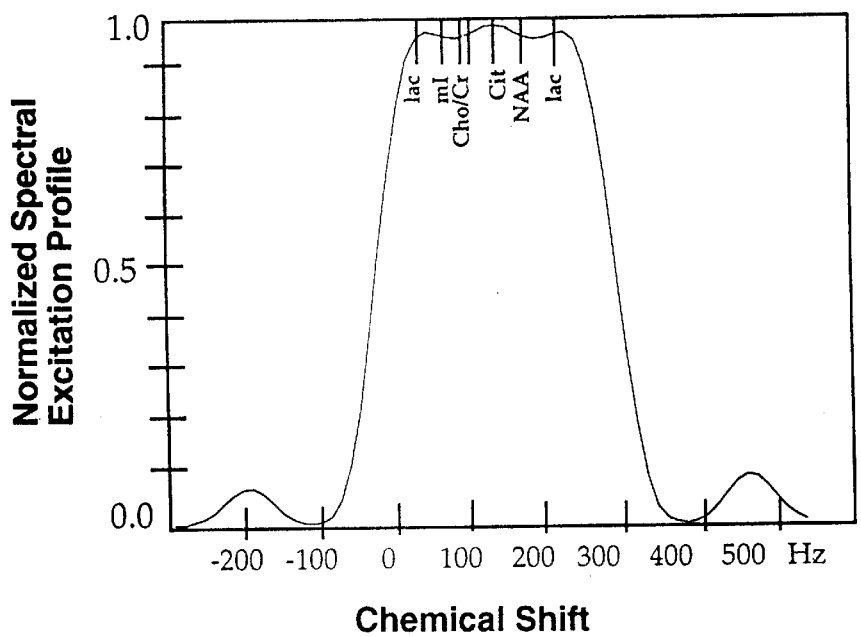

FIGS. 9A, 9B, and 9C show the spectral spatial RF pulse, magnetic field gradient waveform, and resultant passband of a sequence that provides a wide passband. The passband is wide enough. to include the lactate quartet and doublet, choline, creatine, citrate, NAA and mI (myo-inosotol). This example of the present invention can be used to provide passband uniformity, high spatial bandwidth, and short overall pulse duration. Solvent suppression is not desired in this embodiment. The design parameters for the spectral spatial pulses used are $\delta_1$=0.01, $\delta_2$=0.3, PB=360 Hz, TB=6.0, $T_{sub}$=1.0 msec, $N_{sub}$=7. The pulse duration of 7.7 msec was comparable to the length of most spin echo pulses with an equivalent TBs of 6.0. The design resulted in a spatial domain bandwidth of 3.3 kHz, which was achieved, in part, through the use of a variable rate selective excitation (VERSE), which uses nontrapezoidal gradient waveforms to reduce gradient amplitudes and, hence, RF peak power requirements at the sublobe centers (FIG. 9B). Considering the gradient slew rate constraints, the minimum PRESS box size was 1.25 cm. The minimum echo time was 38 msec.

Figure 10A:
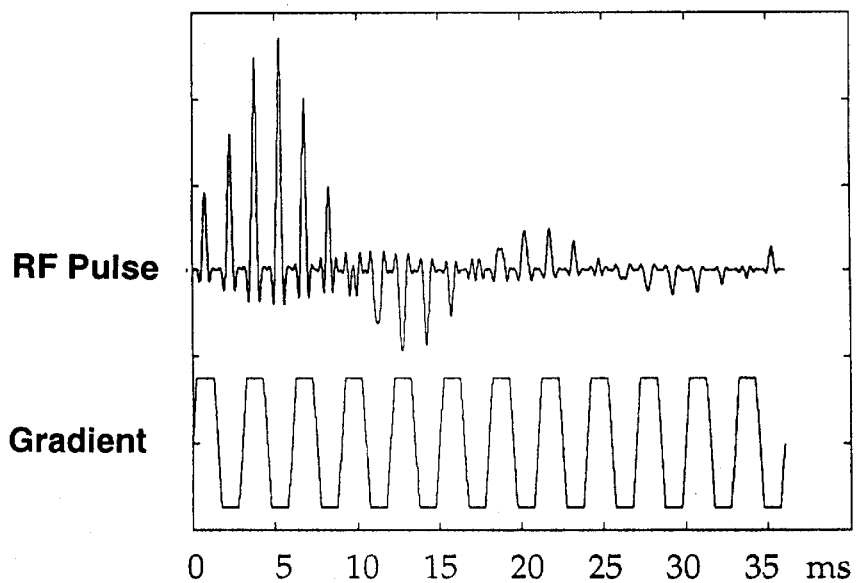
FIGS. 10A, 10B, and 10C show the RF pulse, gradient and passband of a refocusing pulse which is designed to suppress water and lipids and excite only choline, creatine and citrate.
Figure 10B:
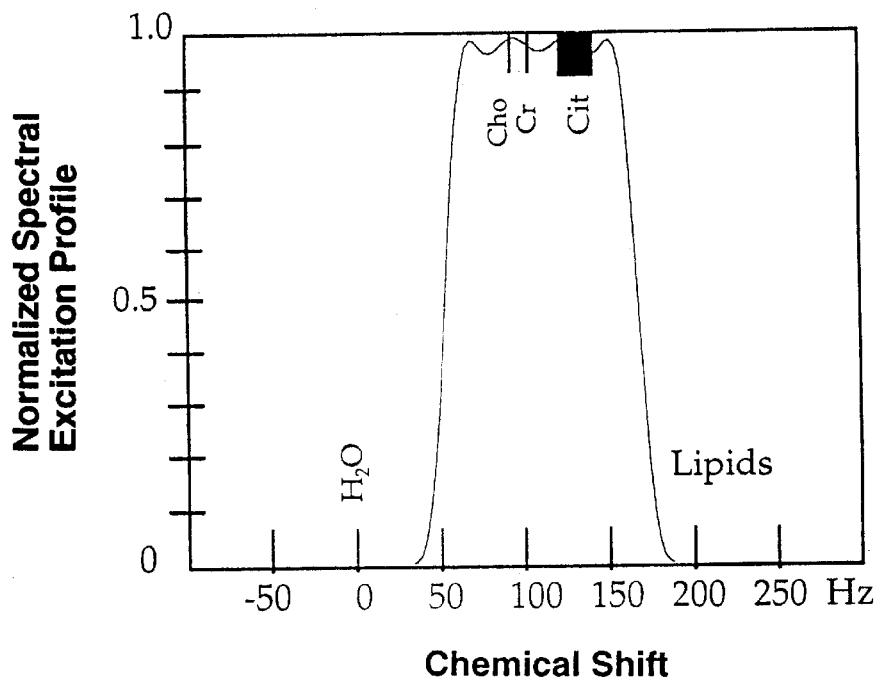
Figure 10C:
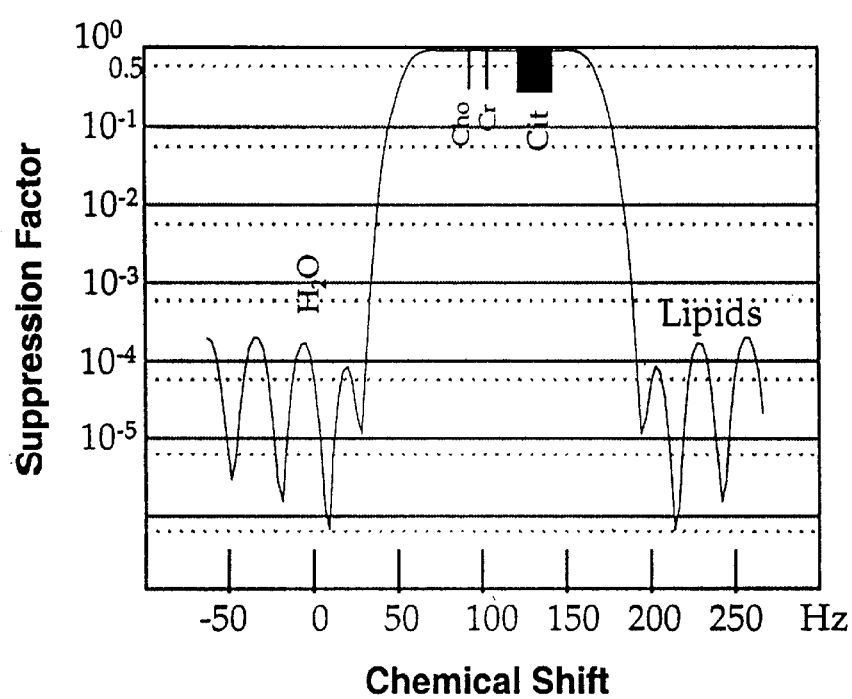

FIGS. 10A, 10B, and 10C show the RF pulse and resultant passband of a sequence which selectively excites choline (Cho), citrate (Cit), and creatine (Cr) and suppresses water and lipids. FIG. 10B shows a spectral excitation profile of the passband and FIG. 10C shows a semilog plot of the passband. The pulse design parameters for this sequence are $\delta_1$=$\delta_2$=0.008, PB=130 Hz, $T_{sub}$=1.5 msec, and $N_{sub}$=24, to achieve a suppression factor of more than $10^4$ with less than 2% passband ripple. The passband includes resonances ranging from choline (96 Hz) to citrate (two overlapping doublets: 120–140 Hz) while allowing a large (+25/−15 Hz) tolerance to B0 inhomogeneities. The chemical shift transition bandwidth was 34 Hz, which attenuated all lipid resonances situated upfield of 1.9 ppm (179 Hz). The spatial bandwidth of the pulse was 4.1 kHz.

It will be clear to one skilled in the art that the above embodiment may be altered in many ways without departing from the scope of the invention. Accordingly, the scope of the invention should be determined by the following claims and their legal equivalents.

What is claimed is:

1. A method for producing a NMR signal localized inside a sample, said method comprising the steps of:
   a) placing said sample in a homogeneous magnetic field;
   b) exciting a slice of said sample using a 90° first RF pulse and a magnetic field gradient in a first direction to select a first excitation plane;
   c) refocusing in a second excitation plane by using a spectral-spatial 180° second RF pulse synchronized with a time-varying magnetic field gradient in a second direction, wherein said second spectral-spatial RF pulse provides spectral selectivity and spatial selectivity in said second direction;
   d) refocusing in a third excitation plane by using a spectral-spatial 180° third RF pulse synchronized with a time-varying magnetic field gradient in a third direction, wherein said third spectral-spatial RF pulse provides spectral selectivity and spatial selectivity in said third direction; and
   e) receiving said NMR signal from a voxel which is defined by the intersection of said first, second, and third excitation planes.

2. The method of claim 1 wherein said steps b, c, d, and e are repeated.

3. The method of claim 2 further comprising the use of spatial encoding gradients to facilitate processing to localize subvoxels within said voxel.

4. The method of claim 1 wherein both said spectral-spatial 180° RF pulses are symmetric in time and therefore have linear phase.

5. The method of claim 1 wherein both said spectral-spatial RF pulses are asymmetric in time and said spectral-spatial third pulse is designed to substantially compensate the phase profile of said spectral-spatial second pulse.

6. The method of claim 5 wherein both said spectral-spatial RF pulses are identical.

7. The method of claim 1 wherein both said spectral-spatial refocusing pulses have a broader passband than all the chemical species of interest such that the chemical shift induced spatial displacement is substantially reduced.

8. The method of claim 1 wherein the spectral profile of said spectral-spatial pulses is designed to refocus a subset of two or more weakly coupled spins so as to refocus the weak coupling.

* * * * *

UNITED STATES PATENT AND TRADEMARK OFFICE
CERTIFICATE OF CORRECTION

| | |
|---|---|
| PATENT NO. | : 6,304,084 B1 |
| DATED | : October 16, 2001 |
| INVENTOR(S) | : Star-Lack et al. |

It is certified that error appears in the above-identified patent and that said Letters Patent is hereby corrected as shown below:

<u>Title page,</u>
Item [75], Inventors, "John Star-Lack" is incorrect. The correct name is
-- Josh M. Star-Lack --.

Signed and Sealed this

Nineteenth Day of March, 2002

Attest:

JAMES E. ROGAN
*Director of the United States Patent and Trademark Office*

*Attesting Officer*